US010062741B2

(12) United States Patent
Okumura et al.

(10) Patent No.: US 10,062,741 B2
(45) Date of Patent: Aug. 28, 2018

(54) METHOD FOR MANUFACTURING BONDED BODY

(71) Applicant: JOLED INC., Tokyo (JP)

(72) Inventors: Hiroko Okumura, Osaka (JP); Takuya Satoh, Kyoto (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/388,874

(22) PCT Filed: Aug. 2, 2013

(86) PCT No.: PCT/JP2013/004711
§ 371 (c)(1),
(2) Date: Sep. 29, 2014

(87) PCT Pub. No.: WO2014/020918
PCT Pub. Date: Feb. 6, 2014

(65) Prior Publication Data
US 2015/0054006 A1    Feb. 26, 2015

(30) Foreign Application Priority Data

Aug. 3, 2012    (JP) ................. 2012-172724

(51) Int. Cl.
*H01L 27/32*    (2006.01)
*H01L 51/00*    (2006.01)
(Continued)

(52) U.S. Cl.
CPC ...... *H01L 27/3251* (2013.01); *B32B 38/0008* (2013.01); *B32B 38/10* (2013.01);
(Continued)

(58) Field of Classification Search
CPC ............. H01L 51/5246; H01L 27/3251; H01L 51/0013; H01L 51/0024; H01L 51/003; H01L 51/56; B32B 38/0008; B32B 38/10
(Continued)

(56) References Cited

U.S. PATENT DOCUMENTS

2005/0069800 A1*  3/2005  Coppenrath ......... G03G 9/0914
                                                   430/108.21
2009/0014873 A1*  1/2009  Yokota .................. B23K 1/018
                                                   257/737
(Continued)

FOREIGN PATENT DOCUMENTS

JP    2005-158481    6/2005
JP    2005-242380    9/2005
(Continued)

OTHER PUBLICATIONS

Nakamura Publication No. 2010-287421 (IDS document of record) machine translation.*
(Continued)

*Primary Examiner* — Allen Parker
*Assistant Examiner* — Patricia Reddington
(74) *Attorney, Agent, or Firm* — Greenblum & Bernstein, P.L.C.

(57) ABSTRACT

A method of manufacturing joined body including: firstly, putting sheet material in intimate contact with first substrate to cover, with resin layer of sheet material, areas of first substrate including first area, boundary area surrounding first area, and second area located across from first area with respect to boundary area, sheet material being laminate including resin layer and separable layer, resin layer containing uncured sealing resin; secondly, curing sealing resin in part of resin layer covering boundary area; thirdly, removing, along with separable layer, part of resin layer covering
(Continued)

second area in one direction from one end towards the other of two ends of second area; and fourthly, joining first substrate and second substrate together by arranging second substrate to face first substrate and curing sealing resin with parts of resin layer covering boundary area and first area located between second substrate and first substrate.

8 Claims, 15 Drawing Sheets

(51) Int. Cl.
```
H01L 51/56      (2006.01)
B32B 38/00      (2006.01)
B32B 38/10      (2006.01)
H01L 51/52      (2006.01)
B32B 37/18      (2006.01)
```

(52) U.S. Cl.
CPC ........ *H01L 51/003* (2013.01); *H01L 51/0013* (2013.01); *H01L 51/0024* (2013.01); *H01L 51/5246* (2013.01); *H01L 51/56* (2013.01); *B32B 37/18* (2013.01); *B32B 2038/0076* (2013.01); *H01L 27/322* (2013.01); *H01L 2227/323* (2013.01)

(58) Field of Classification Search
USPC .......................................................... 257/89
See application file for complete search history.

(56) References Cited

U.S. PATENT DOCUMENTS

| | | | |
|---|---|---|---|
| 2009/0173889 A1* | 7/2009 | Costantino | B81C 1/00071 |
| | | | 250/459.1 |
| 2010/0075563 A1 | 3/2010 | Matsui et al. | |
| 2010/0193961 A1* | 8/2010 | Konishi | C08L 63/00 |
| | | | 257/773 |

FOREIGN PATENT DOCUMENTS

| | | | |
|---|---|---|---|
| JP | 2007-200591 | | 8/2007 |
| JP | 2010-080087 | | 4/2010 |
| JP | 2010-287421 | | 12/2010 |
| JP | 2010287421 A | * | 12/2010 |
| JP | 2011-107432 | | 6/2011 |
| JP | 2012-028169 | | 2/2012 |

OTHER PUBLICATIONS

U.S. Appl. No. 14/388,876 to Hiroko Okumura et al., filed Sep. 29, 2014.
International Search Report (ISR) in International Patent Application No. PCT/JP2013/004711, dated Sep. 24, 2013.

* cited by examiner

FIG. 1
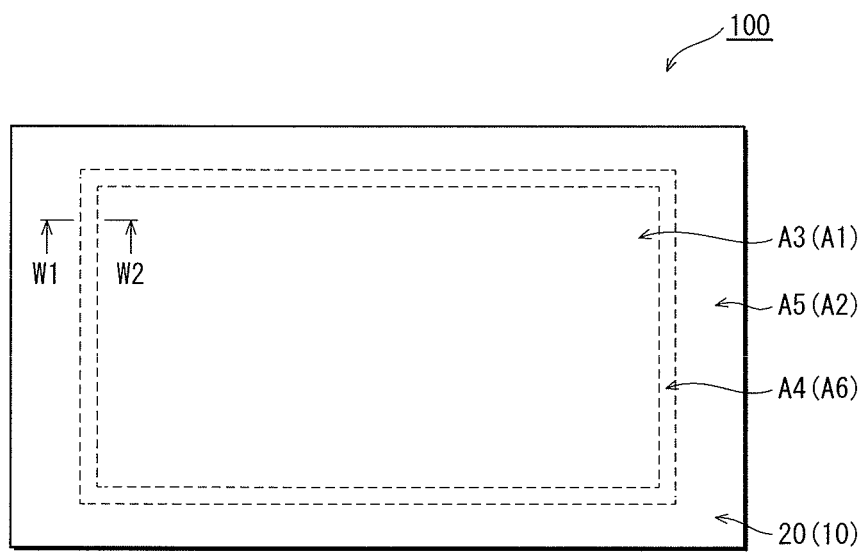
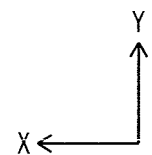

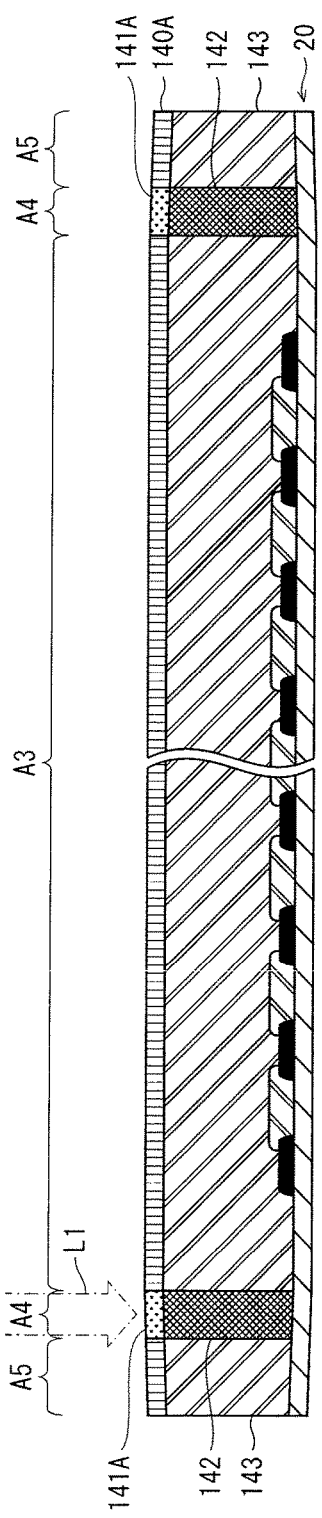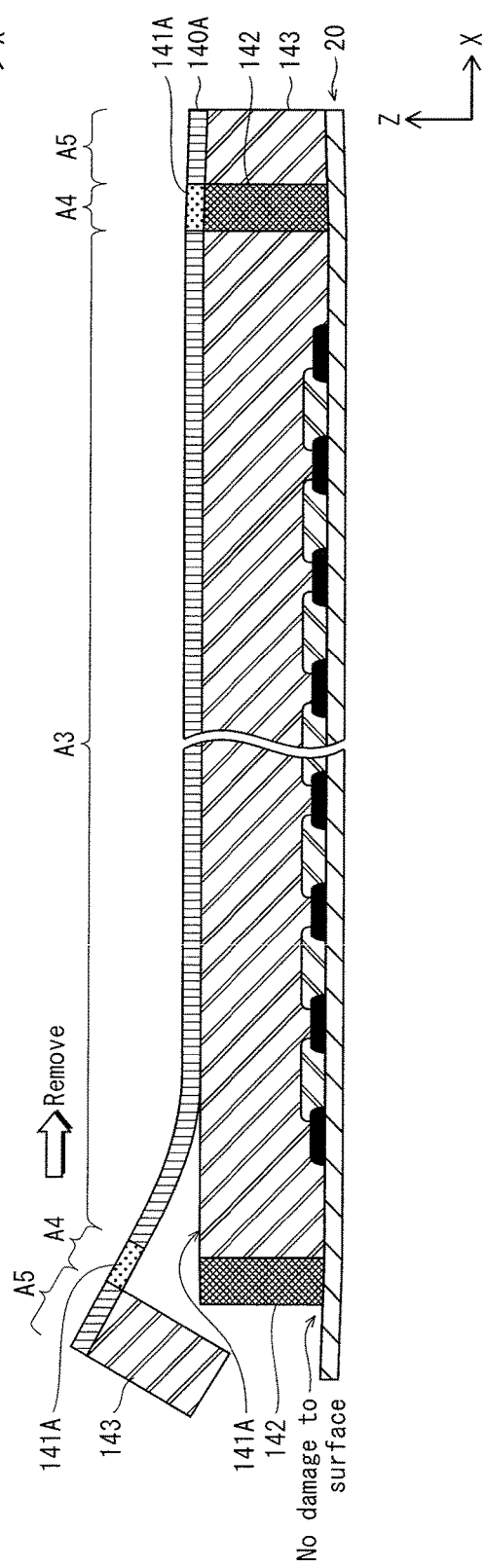

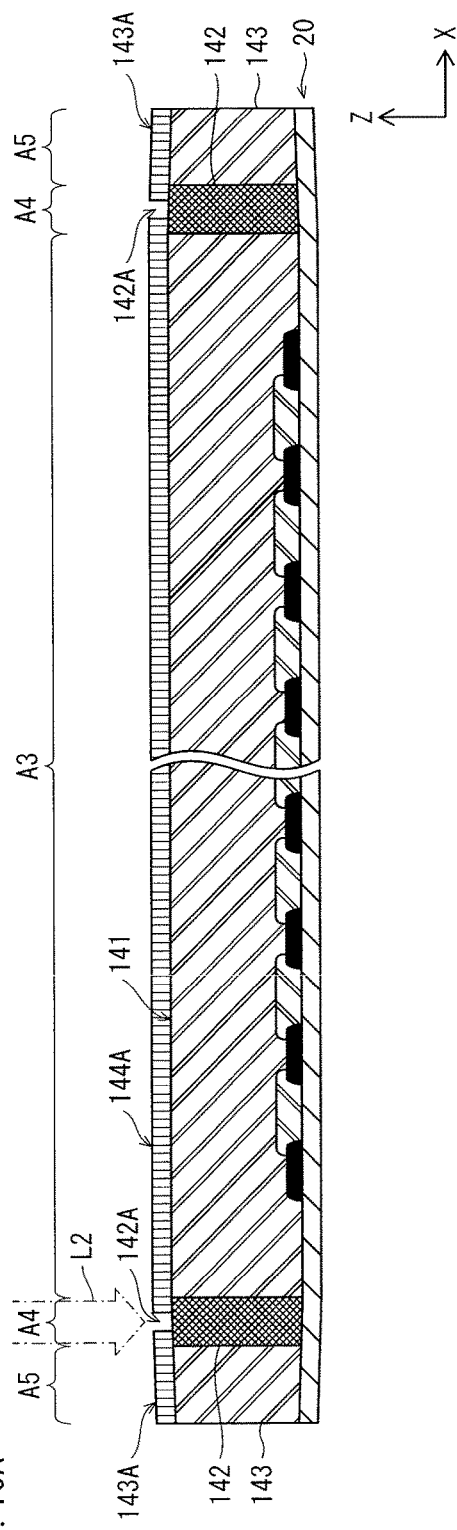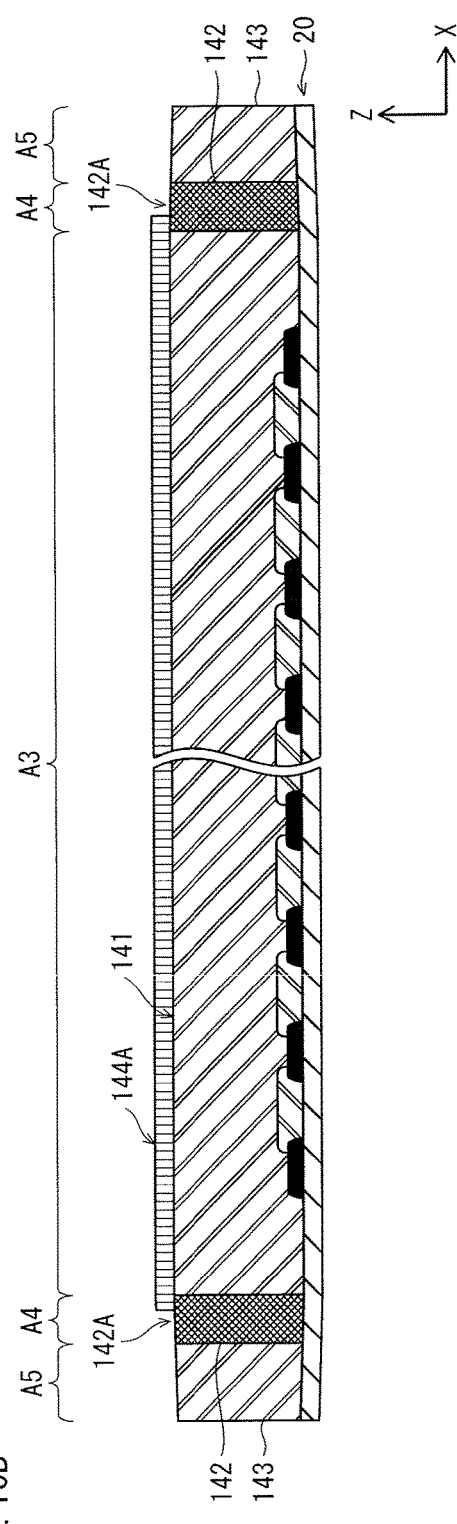

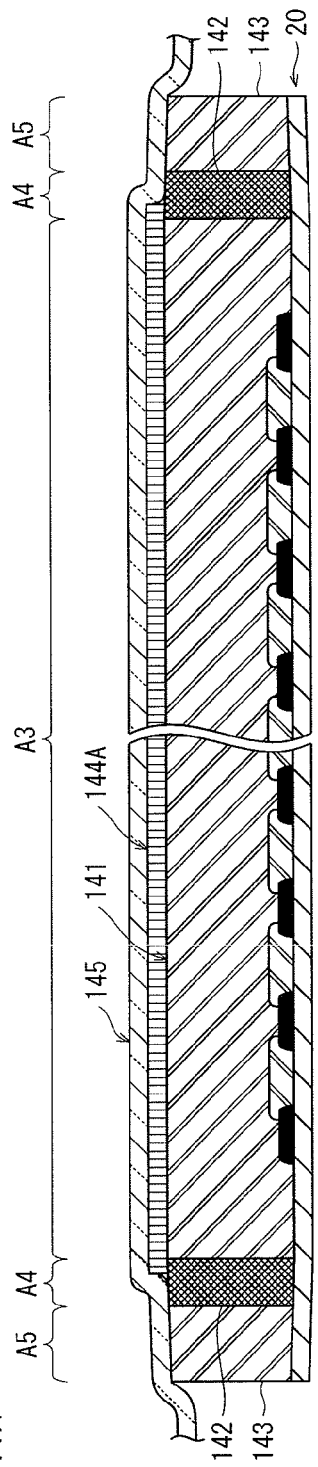
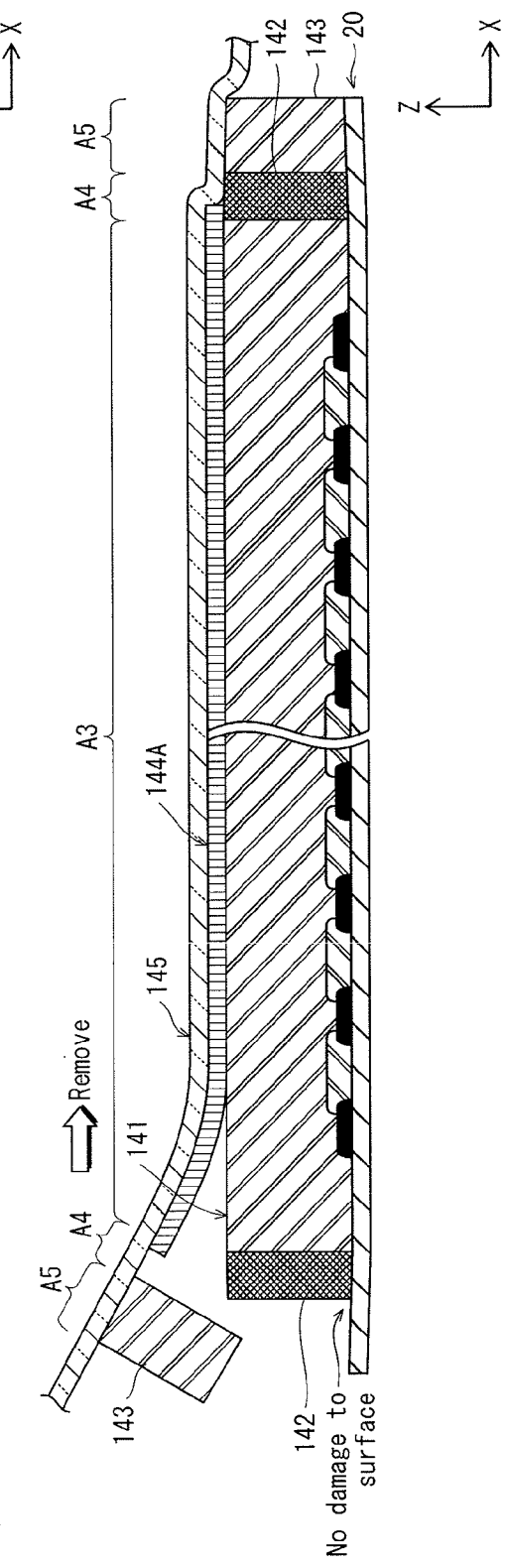
FIG. 11A
FIG. 11B

After removing second separable layer

After removing first separable layer

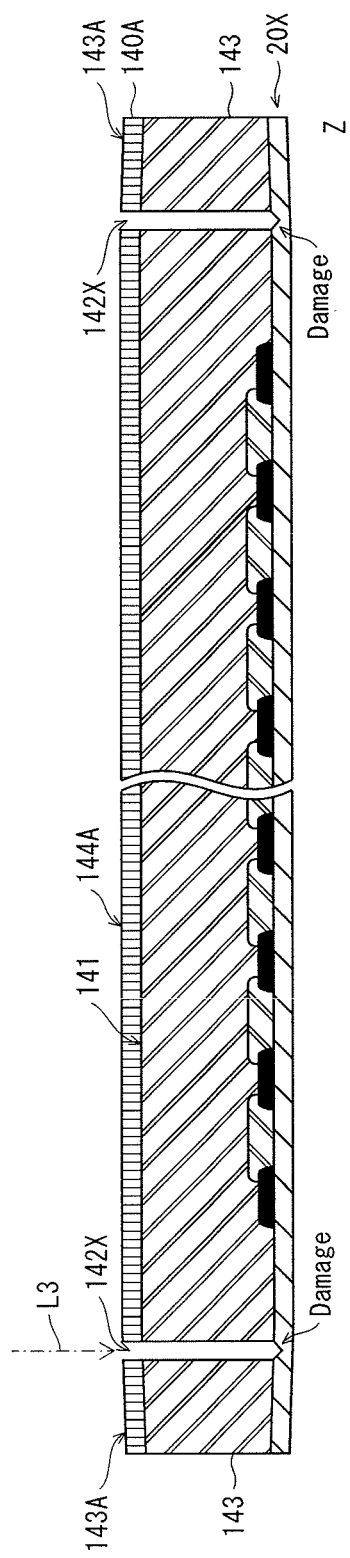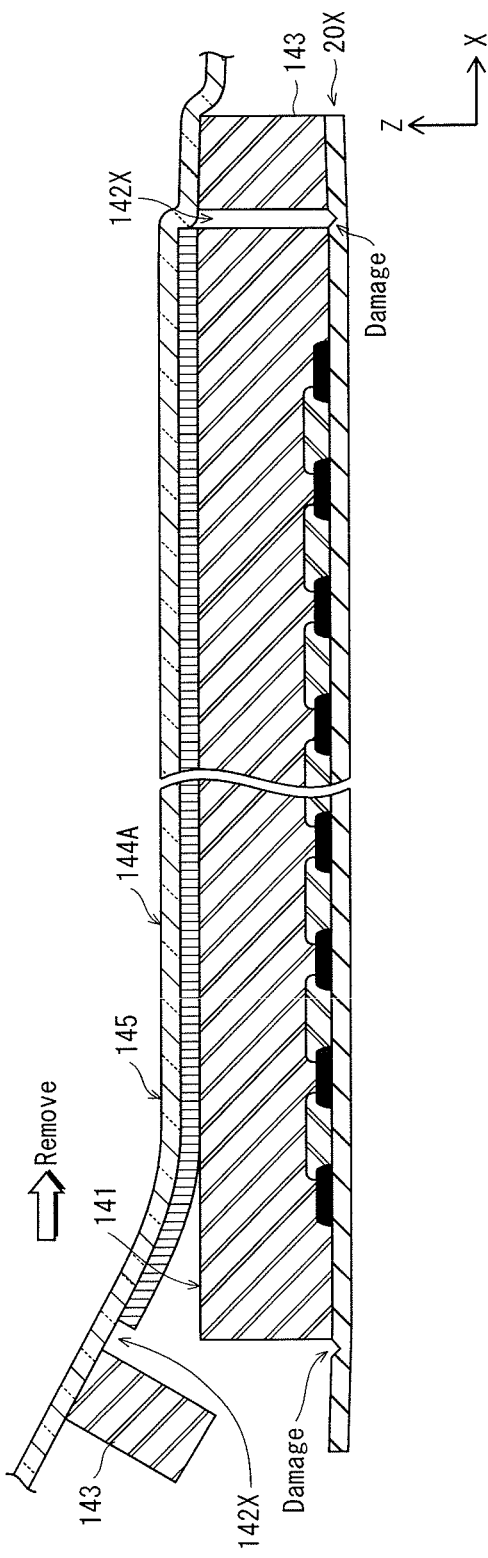

METHOD FOR MANUFACTURING BONDED BODY

TECHNICAL FIELD

The present disclosure relates to a method of manufacturing a joined body. In particular, the present disclosure relates to a method of manufacturing a joined body by using a sheet material.

BACKGROUND ART

Conventional technology provides a joined body that includes two substrates joined together via resin. The two substrates, for example, may be an EL substrate including a plurality of organic EL elements and a CF substrate including a plurality of color filter layers. Joining an EL substrate and a CF substrate together by using resin provides an organic EL display panel (Patent Literature 1).

CITATION LIST

Patent Literature

[Patent Literature 1]
Japanese Patent Application Publication No. 2007-200591

SUMMARY

Technical Problem

As a method for joining two substrates together via resin as described above, conventional technology proposes, for example, using a sheet material including a sheet of resin in uncured state sandwiched between a pair of separable layers (film layers). This allows easy handling of resin in uncured state.

However, a manufacturing process of arranging uncured resin having a predetermined shape at a predetermined position on a first substrate and adhering a second substrate may have low positional accuracy.

In view of the technical problem described above, the present disclosure aims to provide a method of manufacturing a joined body that yields an excellent joined body, by not damaging a first substrate and enabling disposing resin at a predetermined position on the first substrate.

Solution to Problem

In view of the technical problem described above, the present disclosure provides as one aspect thereof a method of manufacturing a joined body including: putting a sheet material in intimate contact with a first substrate to cover, with a resin layer of the sheet material, areas of the first substrate including a first area, a boundary area that surrounds the first area, and a second area that is located across from the first area with respect to the boundary area, the sheet material being a laminate including the resin layer and a separable layer, the resin layer containing sealing resin in uncured state; curing the sealing resin in a part of the resin layer covering the boundary area, after putting the sheet material in intimate contact with the first substrate; removing, along with the separable layer, a part of the resin layer covering the second area in one direction from one end towards the other of two ends of the second area, after curing the part of the resin layer covering the boundary area; and joining the first substrate and a second substrate together by arranging the second substrate to face the first substrate and curing the sealing resin, after removing the separable layer and the part of the resin layer covering the second area, the arranging performed with the part of the resin layer covering the boundary area and the part of the resin layer covering the first area located between the second substrate and the first substrate.

Advantageous Effects

In the method pertaining to one aspect of the present disclosure, after covering, with the resin layer (i.e., the sealing resin in uncured state), the first area of the first substrate and the boundary area of the first substrate, which surrounds the first area, the sealing area in the part of the resin layer covering the boundary area is cured, whereby a part of cured sealing resin is formed. This makes a conventional process of cutting sealing resin in uncured state by using a laser beam, in which the first substrate may be damaged, unnecessary. Thus, damaging the first substrate through such a process is prevented.

In the method pertaining to one aspect of the present disclosure, the part of the resin layer (i.e., the sealing resin in uncured state) covering the second area is removed in one direction from one end towards the other of two ends of the second area, along with the separable layer. Thus, the part of the sealing resin in uncured state located outside the cured sealing resin part (i.e., the sealing area in the part of the resin layer covering the boundary area) is removed from the surface of the first substrate at the same time as the separable layer.

Here, note that the cured sealing resin part has a certain level of hardness, and adheres to the substrate at a higher level compared to before the curing. Thus, the movement of the cured sealing resin part accompanying the movement of the separable layer is smaller than the movement of an uncured sealing resin part located outside the cured sealing resin part accompanying the movement of the separable layer. Thus, even when the uncured sealing resin part located outside the cured sealing resin part is removed from the first substrate along with the separable layer, the cured sealing resin part is not likely to be removed along with the separable layer, and thus remains in intimate contact with the first substrate.

By taking advantage of such difference in characteristics of the cured sealing resin part and the uncured sealing resin part located outside the cured sealing resin part, the method pertaining to one aspect of the present disclosure enables selectively removing the uncured sealing resin part located outside the cured sealing resin part while maintaining the cured sealing resin part and an uncured sealing resin part located inside the cured sealing part in intimate contact with the first substrate. This is achieved by removing the uncured sealing resin part located outside the cured sealing resin part from the first substrate in the direction from one end towards the other of the second area, along with the separable layer.

Thus, the method pertaining to one aspect of the present disclosure yields an excellent joined body, by not damaging the first substrate and enabling disposing sealing resin at a predetermined position on the first substrate.

BRIEF DESCRIPTION OF DRAWINGS

FIG. 1 illustrates a front side of an organic EL display panel in embodiment 1.

Each of FIGS. 3A through 3D is a cross-sectional view illustrating a step in the manufacturing of the organic EL display panel in embodiment 1.

Figure 4A:
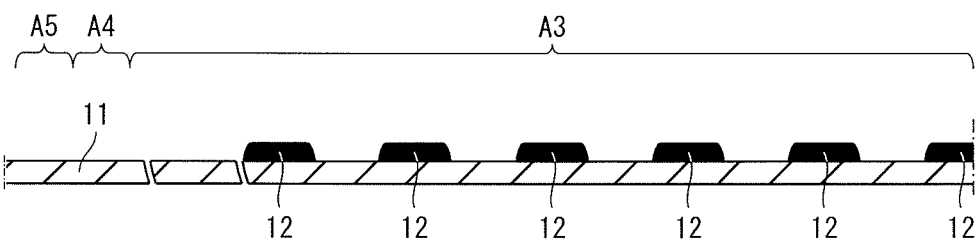
Figure 4B:
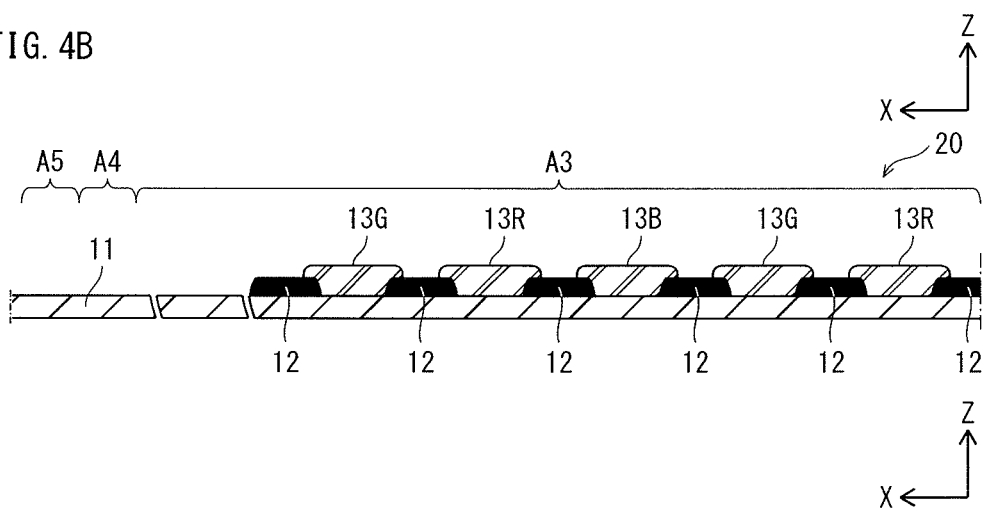

Each of FIGS. 4A and 4B is a cross-sectional view illustrating a step in the manufacturing of a CF substrate in embodiment 1.

Figure 5A:
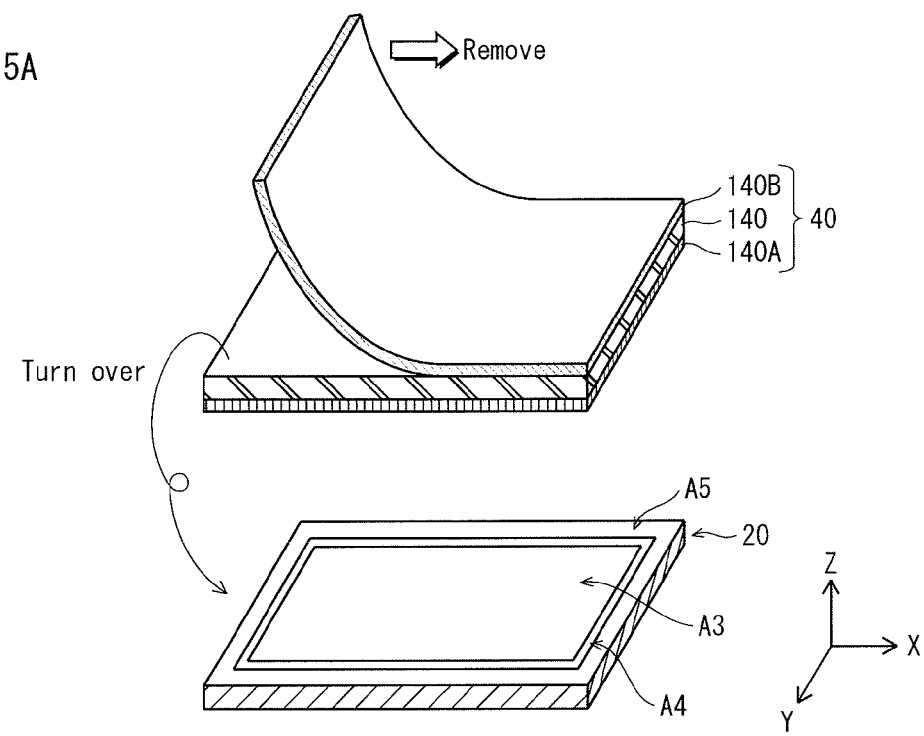
Figure 5B:
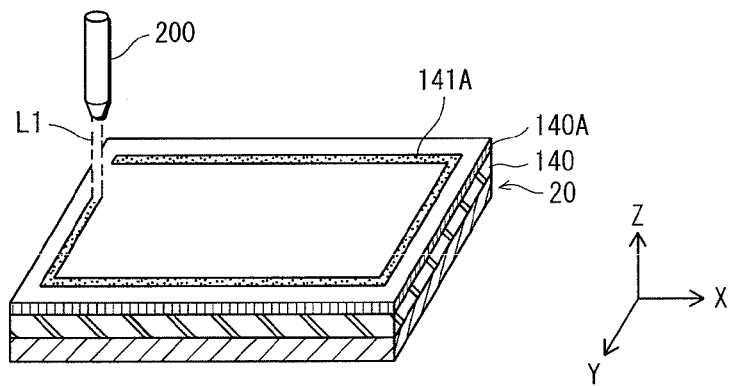
Figure 5C:
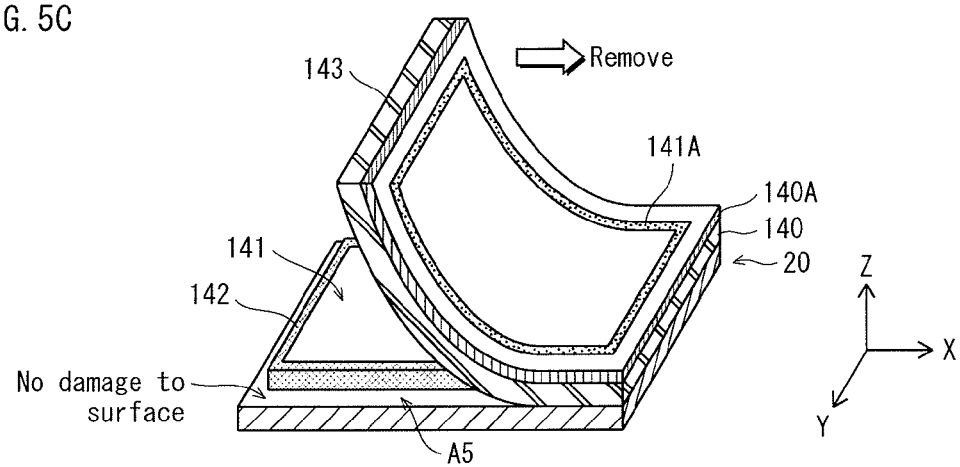

Each of FIGS. 5A through 5C is a perspective view illustrating a step in the manufacturing of the organic EL display panel in embodiment 1.

Figure 6A:
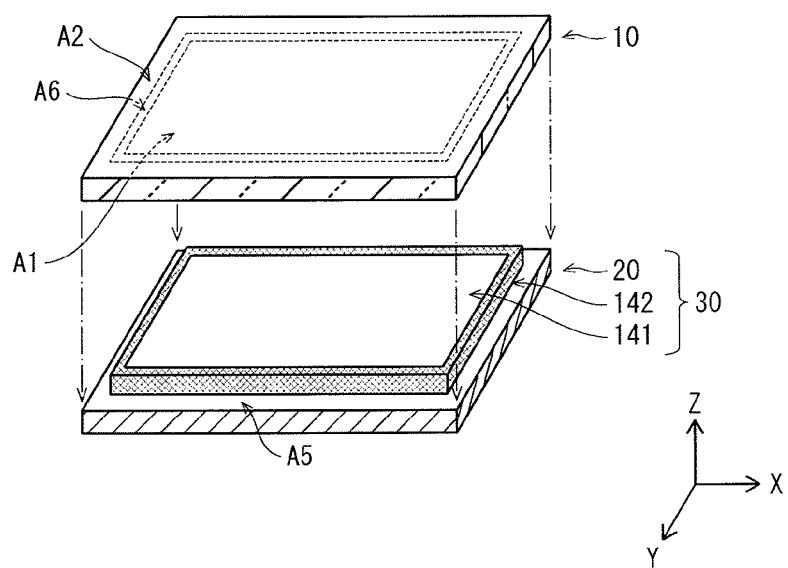
Figure 6B:
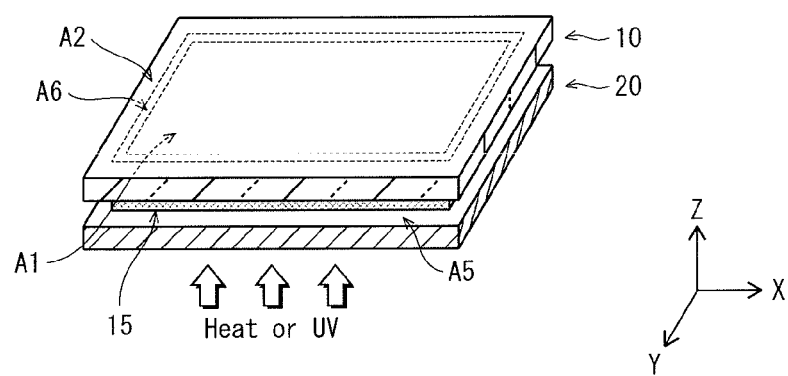

Each of FIGS. 6A and 6B is a perspective view illustrating a step in the manufacturing of the organic EL display panel in embodiment 1.

Each of FIGS. 7A and 7B is a cross-sectional view illustrating a step in the manufacturing of the organic EL display panel in embodiment 1.

Figure 8A:
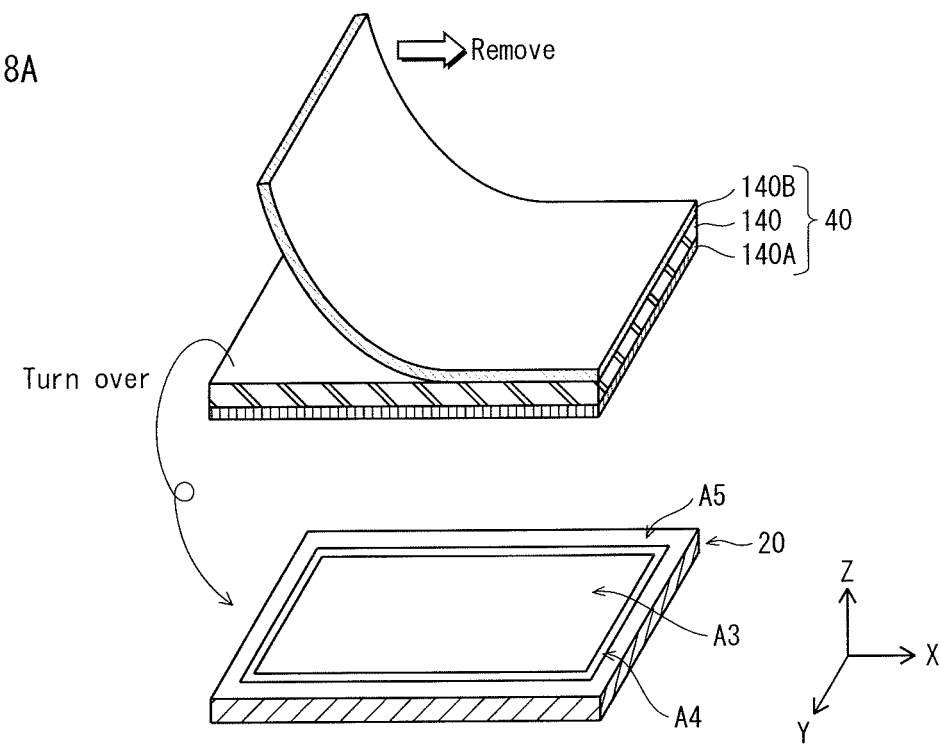
Figure 8B:
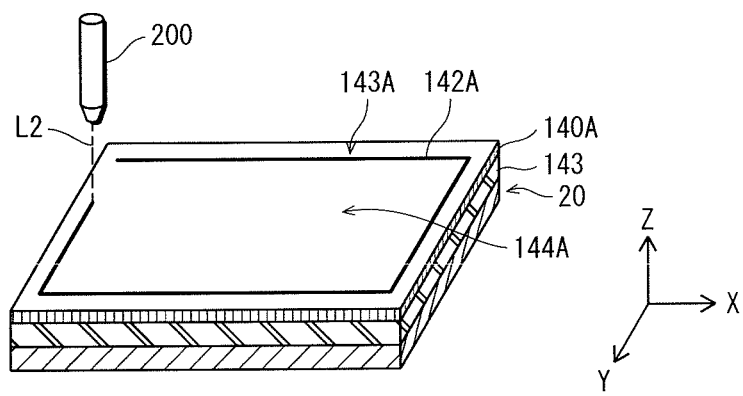
Figure 8C:
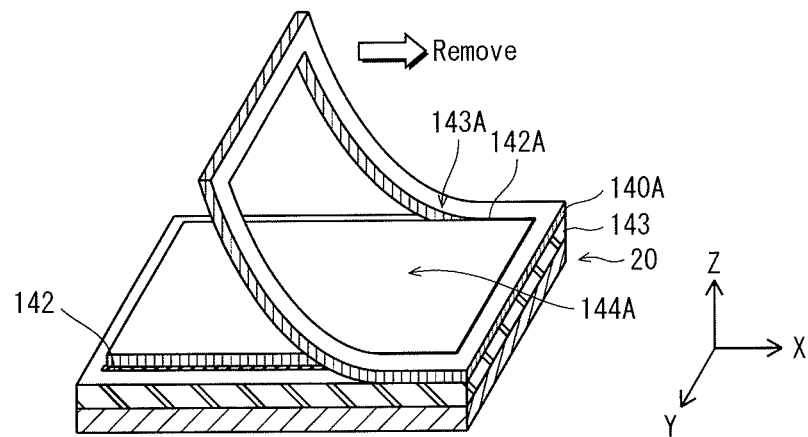

Each of FIGS. 8A through 8C is a perspective view illustrating a step in the manufacturing of an organic EL display panel in embodiment 2.

Each of FIGS. 9A through 9D is a perspective view illustrating a step in the manufacturing of the organic EL display panel in embodiment 2.

Each of FIGS. 10A and 10B is a cross-sectional view illustrating a step in the manufacturing of the organic EL display panel in embodiment 2.

Each of FIGS. 11A and 11B is a cross-sectional view illustrating a step in the manufacturing of the organic EL display panel in embodiment 2.

Figure 12:
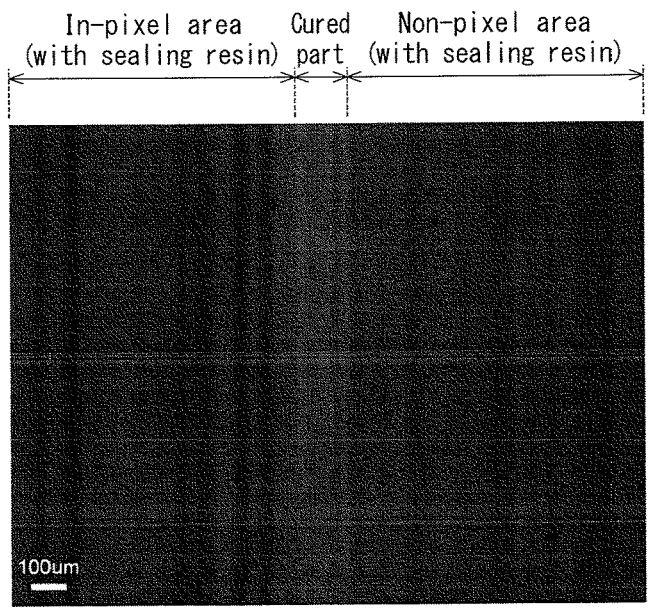

FIG. 12 is a photograph indicating state of uncured sealing resin and a cured sealing resin part immediately after a boundary area curing step.

Figure 13:
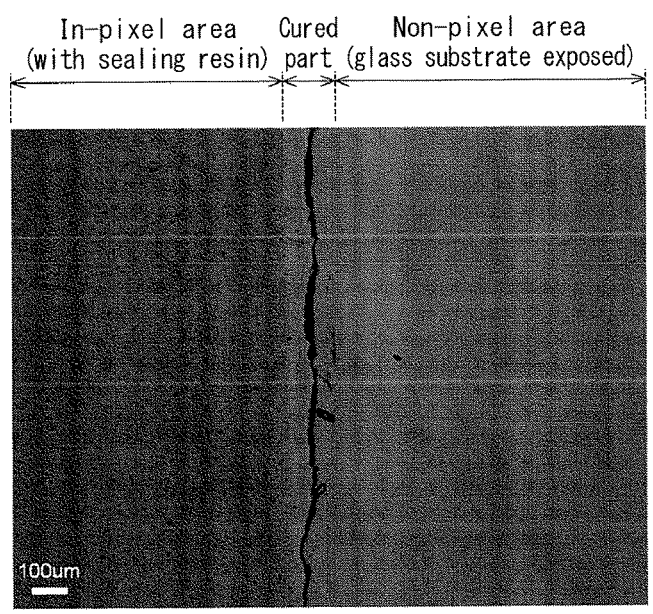

FIG. 13 is a photograph indicating state of uncured sealing resin and the cured sealing resin part immediately after a removing step.

Figure 14A:
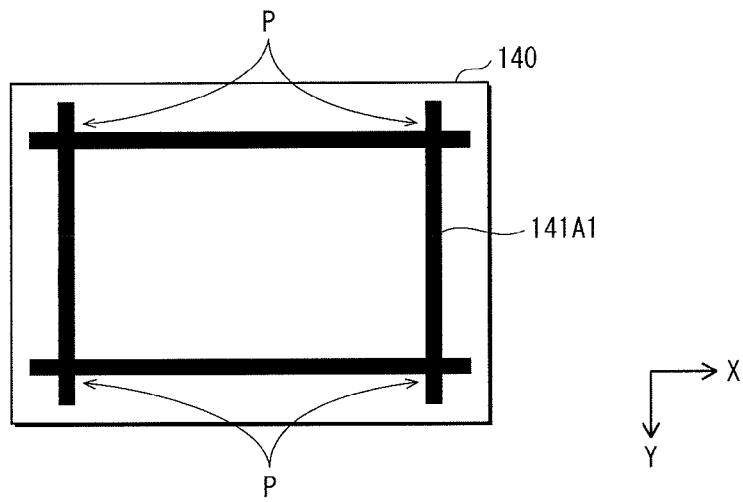
Figure 14B:
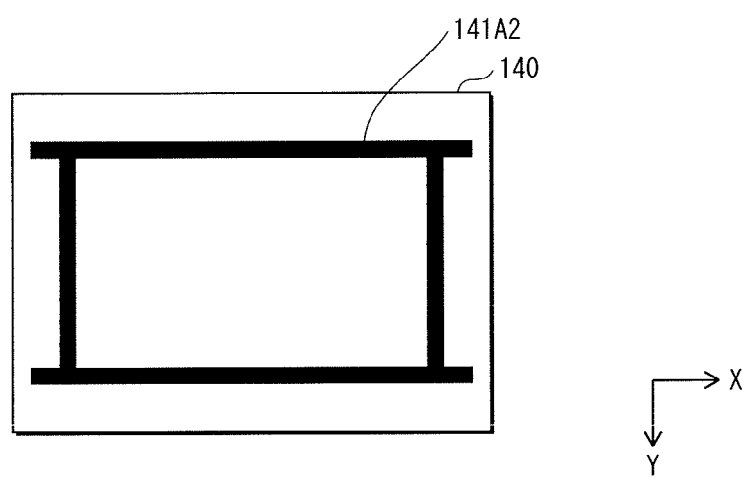
Figure 14C:
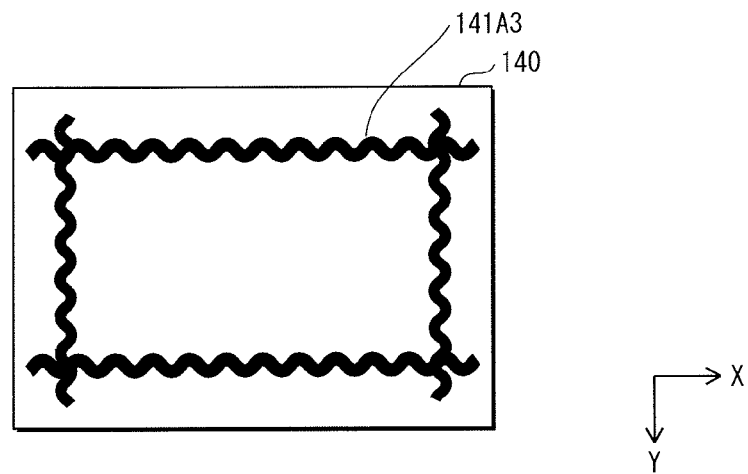

Each of FIGS. 14A through 14C illustrates a modified laser beam trace in the boundary area curing step.

Figure 15A:
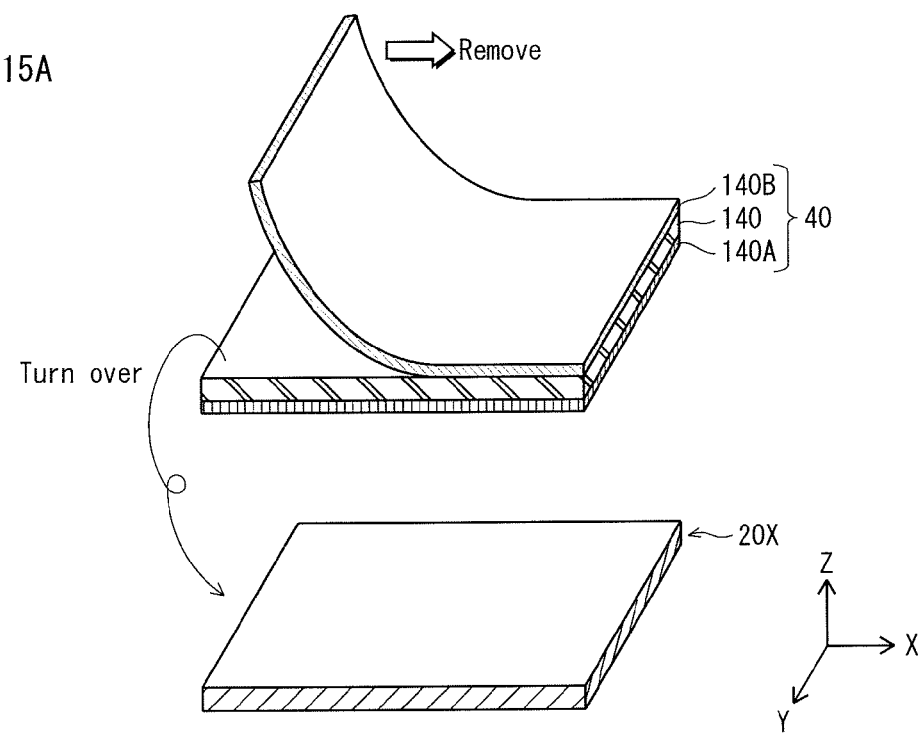
Figure 15B:
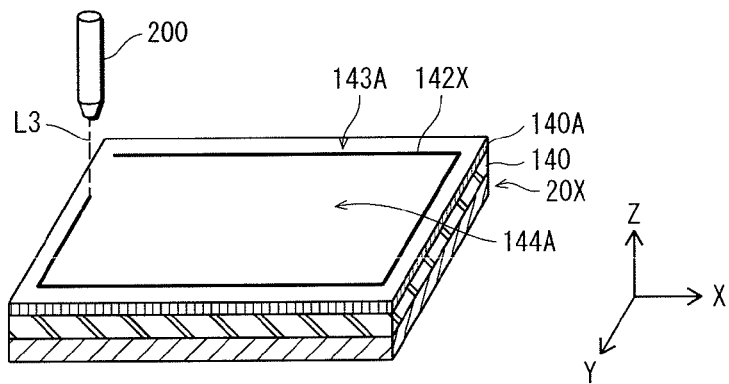
Figure 15C:
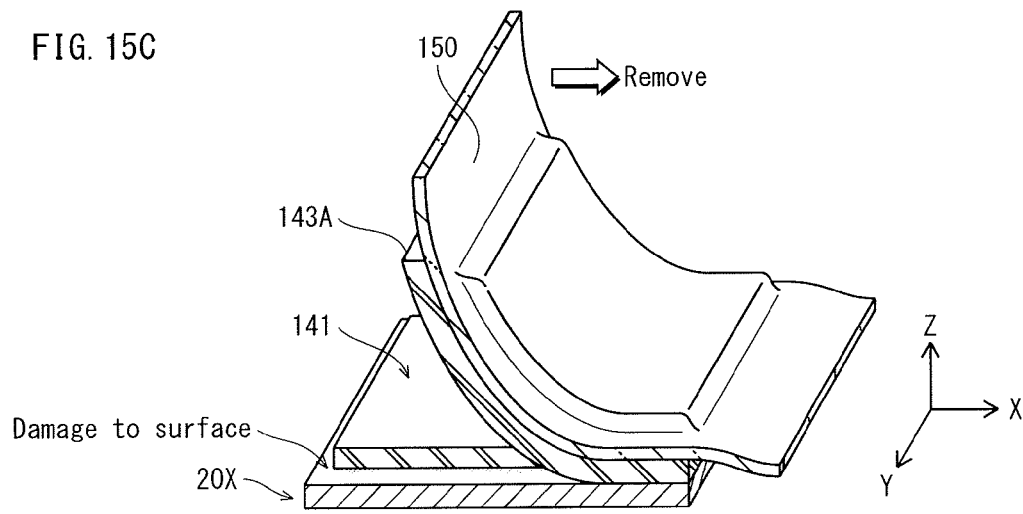

Each of FIGS. 15A through 15C is a perspective view illustrating a step in the manufacturing of a joined body.

Each of FIGS. 16A and 16B is a cross-sectional view illustrating a step in the manufacturing of the joined body.

DESCRIPTION OF EMBODIMENTS

<Aspects of Present Disclosure>

One aspect of the present disclosure is a method of manufacturing a joined body including: putting a sheet material in intimate contact with a first substrate to cover, with a resin layer of the sheet material, areas of the first substrate including a first area, a boundary area that surrounds the first area, and a second area that is located across from the first area with respect to the boundary area, the sheet material being a laminate including the resin layer and a separable layer, the resin layer containing sealing resin in uncured state; curing the sealing resin in a part of the resin layer covering the boundary area, after putting the sheet material in intimate contact with the first substrate; removing, along with the separable layer, a part of the resin layer covering the second area in one direction from one end towards the other of two ends of the second area, after curing the part of the resin layer covering the boundary area; and joining the first substrate and a second substrate together by arranging the second substrate to face the first substrate and curing the sealing resin, after removing the separable layer and the part of the resin layer covering the second area, the arranging performed with the part of the resin layer covering the boundary area and the part of the resin layer covering the first area located between the second substrate and the first substrate.

Here, note that in the present disclosure, the term "curing" is used in the sense that sealing resin, when cured, has a higher level of hardness compared to before the curing. That is, in the present disclosure, the term "curing" is not necessarily used in the sense that sealing resin, when cured, is completely hardened.

In the method pertaining to one aspect of the present disclosure, in the removing of the separable layer and the part of the resin layer covering the second area, adhesion between the first substrate and the part of the resin layer covering the boundary area may be greater than adhesion between the first substrate and the part of the resin layer covering the second area.

In the method pertaining to one aspect of the present disclosure, the resin layer may contain heat curable resin, and the curing of the part of the resin layer covering the boundary area may be performed by heating the part of the resin layer covering the boundary area.

In the method pertaining to one aspect of the present disclosure, the resin layer may contain energy ray curable resin, and the curing of the part of the rein layer covering the boundary area may be performed by radiating an energy ray with respect to the part of the rein layer covering the boundary area.

In the method pertaining to one aspect of the present disclosure, the energy ray may be one of a laser beam and an ultraviolet ray.

In the method pertaining to one aspect of the present disclosure, after the joining of the first substrate and the second substrate, a degree of polymerization of the sealing resin may be higher in the part of the resin layer covering the boundary area than in the part of the resin layer covering the first area.

In the method pertaining to one aspect of the present disclosure, the removing of the separable layer and the part of the resin layer covering the second area may be performed by peeling off, along with the separable layer, the part of the resin layer covering the second area in the one direction.

In the method pertaining to one aspect of the present disclosure, in the curing of the part of the resin layer covering the boundary area, irradiation with the laser beam may cure the sealing resin in the part of the resin layer covering the boundary area and cut a part of the separable layer corresponding to the boundary area, and in the removing of the separable layer and the part of the resin layer covering the second area, a part of the separable layer corresponding to the second area may be removed along with the part of the resin layer covering the second area.

In the method pertaining to one aspect of the present disclosure, the removing of the part of the separable layer corresponding to the second area and the part of the resin layer coving the second area may include: removing the part of the separable layer corresponding to the second area; adhering a removal tape to extend over the part of the separable layer corresponding to the first area and the part of the resin layer covering the second area, after removing the part of the separable layer corresponding to the second area; and removing, along with the removal tape, the part of the separable layer corresponding to the first area and the part of the resin layer covering the second area in the one direction, after adhering the removal tape to extend over the part of the separable layer corresponding to the first area and the part of the resin layer covering the second area.

In the method pertaining to one aspect of the present disclosure, a plurality of light-emission elements may be disposed in an area of the second substrate that faces the first area.

In the method pertaining to one aspect of the present disclosure, a plurality of color filter layers may be disposed in the first area.

In the method pertaining to one aspect of the present disclosure, the first substrate may have a belt-like shape and the first area may be disposed in plurality in the first substrate in a lengthwise direction.

Another aspect of the present disclosure is a joined body including a first substrate; a first sealing resin layer that covers a first area of the first substrate; a second sealing resin layer that covers a boundary area of the first substrate, is continuous with the first sealing resin layer, and contains the same material as the first sealing resin layer, the boundary area being an area of the first substrate surrounding the first area; and a second substrate that is joined with the first substrate via the first sealing resin layer and the second sealing resin layer. In the joined body, an average film thickness of the second sealing resin layer is smaller than a maximum film thickness of the first sealing resin layer.

In the joined body pertaining to one aspect of the present disclosure, the first substrate may have a plate-like shape and a plurality of light-emission elements may be disposed in the first area.

In the joined body pertaining to one aspect of the present disclosure, the second substrate may have a plate-like shape and a plurality of color filter layers may be disposed in an area of the second substrate facing the first area of the first substrate, the color filter layers disposed such that a position of each of the color filter layers corresponds to a position of one of the light-emission elements.

In the joined body pertaining to one aspect of the present disclosure, a degree of polymerization of the same material may be higher in the second sealing resin layer than in the first sealing resin layer.

<Matters Underlying Disclosure>

In a process of manufacturing a joined body, for example, a sheet material including a sheet of uncured sealing resin sandwiched between a pair of separable layers (film layers) is used. This allows easy handling of uncured sealing resin.

Each of FIGS. 15A through 15C is a perspective view illustrating a step in the manufacturing of a joined body involving use of such a sheet material. Each of FIGS. 16A and 16B is a cross-sectional view illustrating a step in the manufacturing of a joined body involving use of such a sheet material.

First, as illustrated in FIG. 15A, a sheet material 40 is prepared. The sheet material 40 includes a pair of separable layers (a first separable layer 140A and a second separable layer 140B) and a sheet of uncured sealing resin 140 sandwiched between the pair of separable layers. For example, the uncured sealing resin 140 may be ultraviolet curable resin or heat curable resin.

Subsequent removal of the second separable layer 140B exposes one face of the uncured sealing resin 140. Then, the uncured sealing resin 140 is turned over, and the exposed face of the uncured sealing resin 140 is put in intimate contact with a surface of a first substrate 20X.

Next, as illustrated in FIGS. 15B and 16A, a laser beam L3 is radiated from outside the first separable layer 140A. The laser beam L3 cuts the first separable layer 140A and the uncured sealing resin 140 at the same time. In FIGS. 15B and 16A, reference sign 142X indicates the trace left by the laser beam L3 (areas that are cut by the laser beam L3). The laser beam L3 forms a non-removal sealing resin part 141 and a first separable layer inner part 144A inside the laser beam trace 142X, and forms an unnecessary sealing resin part 143 and a first separable layer outer part 143A outside the laser beam trace 142X (FIG. 16A).

Subsequently, the first separable layer outer part 143A is removed, and a removal tape 145 is adhered to extend entirely over the surface of the first separable layer inner part 144A and the surface of the unnecessary sealing resin part 143. Then, as illustrated in FIGS. 15C and 16B, the removal tape 145 is removed away from the first substrate 20X, along with the unnecessary sealing resin part 143 and the first separable layer inner part 144A, in the X direction from one end to the other of the first substrate 20X. This results in only the non-removal sealing resin part 141 remaining on the first substrate 20X.

Following this, an undepicted second substrate is arranged to face the first substrate 20X with the non-removal sealing resin part 141 located between the first substrate 20X and the second substrate. Further, heating of the non-removal sealing resin part 141 is performed, whereby the non-removal sealing resin part 141 is cured and a resin sealing layer is formed. Thus, a joined body is yielded.

In the above-described method of manufacturing a joined body, the laser beam L3 may irradiate the surface of the first substrate 20X within an area existing at a boundary between the non-removal sealing resin part 141 and the unnecessary sealing resin part 143 (i.e., the area corresponding to the laser beam trace 142X) as illustrated in FIG. 16A and damage the first substrate 20X, when radiated for cutting the unnecessary sealing resin part 143. FIG. 16A illustrates a state where damage, in the form of a groove, is formed in the surface of the first substrate 20X due to irradiation with the laser beam L3.

A joined body including a first substrate 20X damaged as described above may have insufficient strength around the damage, and may undergo problems such as cracking and destruction during use thereof.

In view of such problems, the present disclosure provides a method of manufacturing a joined body yielding an excellent joined body, by not damaging a first substrate and enabling disposing sealing resin at a predetermined position on the first substrate, as described in the following embodiments.

Embodiment 1

The following describes an organic EL display panel 100 pertaining to embodiment 1, which is one example of a joined body pertaining to the present disclosure.

(Organic EL Display Panel 100)

FIG. 1 illustrates a front side of an organic EL display panel 100 in embodiment 1 (in the following, simply referred to as a "panel 100"). In specific, FIG. 1 is an X-Y plane view illustrating the front side of the panel 100, which includes pixels of the organic EL display panel 100 and areas around the pixels.

Figure 2:
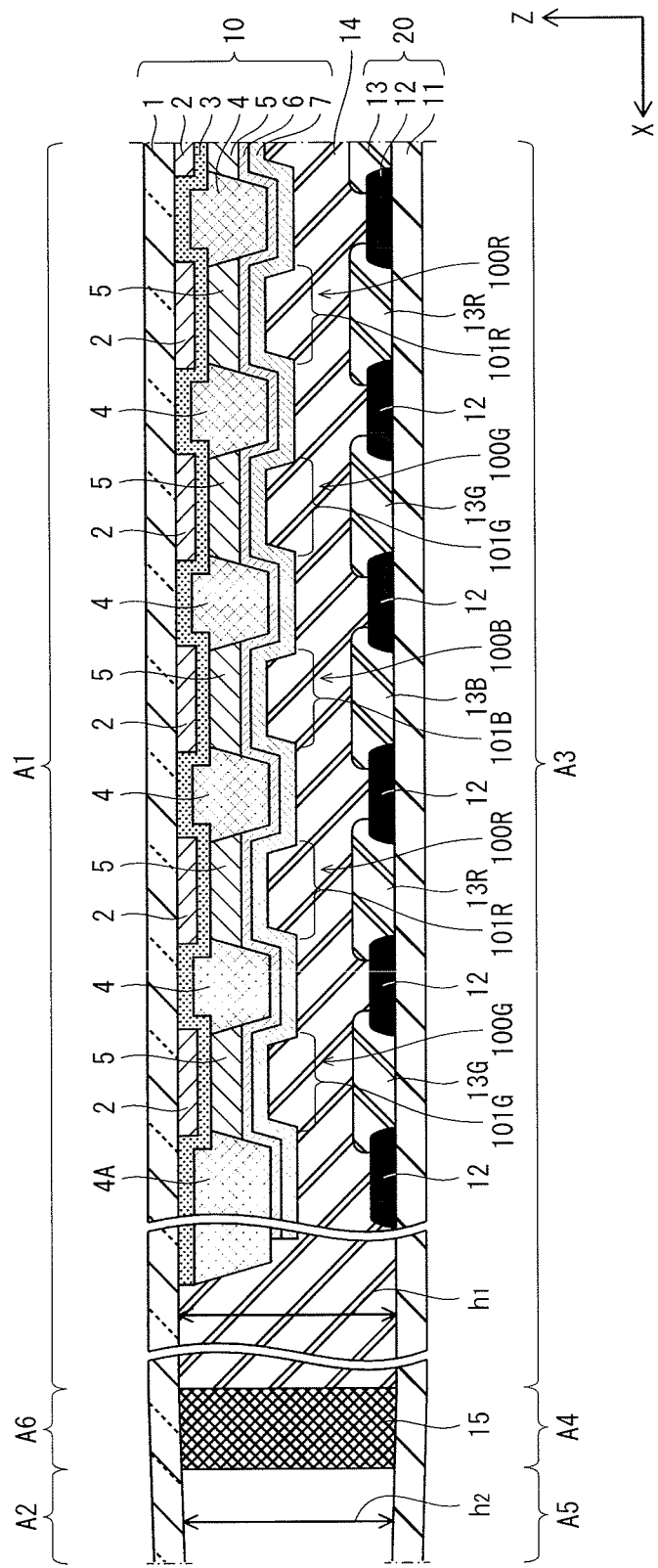
FIG. 2 illustrates a cross-section of the organic EL display panel in embodiment 1.

FIG. 2 is a X-Z plane cross-sectional view illustrating a cross-section of the panel 100 along line W1-W2 in FIG. 1.

As illustrated in FIG. 1, the panel 100 is a display whose main surface has a rectangular overall shape. The following provides description on the overall structure of the panel 100. As illustrated in FIG. 2, the panel 100 includes a first substrate (an EL substrate 10), a second substrate (a CF substrate 20), a resin sealing layer 14, and a cured sealing resin part 15. The EL substrate 10 is joined together with the CF substrate 20 via the resin sealing layer 14 and the cured sealing resin part 15. Thus, the panel 100 is a joined body. Note that in FIG. 1, the panel 100 is illustrated with the CF substrate 20 on the front side and with the EL substrate 10 on the rear side.

[EL Substrate 10]

As illustrated in FIG. 1, the EL substrate 10 has a display area A1 for screen display, a boundary area A6 surrounding the display area A1, and a peripheral area A2 that is located further outwards than the boundary area A6.

As illustrated in FIG. 2, within the display area A1, a plurality of barrier walls (banks) 4 and a plurality of organic EL elements 100R, 100G, 100B are disposed. The organic EL elements 100R correspond to light-emission color R (red), the organic EL elements 100G correspond to light-emission color G (green), and the organic EL elements 100B correspond to light-emission color B (blue). The organic EL elements 100R, 100G, 100B are each disposed repeatedly in the X direction. Specifically, the organic EL elements 100R, 100G, 100B are formed with respect to openings 101R, 101G, 101B, respectively. The openings 101R, 101G, 101B are formed between adjacent barrier walls (banks) 4. Note that each organic EL element (100R, 100G, 100B) is one sub-pixel of the panel 100. Further, a set of one organic EL element 100R, one organic EL element 100G, and one organic EL element 100B that are adjacent to one another forms one pixel of the panel 100.

Each organic EL element (100R, 100G, 100B) includes a TFT substrate 1 (in the following, simply referred to as "substrate 1") and layers disposed above an upper surface of the TFT substrate 1. Namely, an anode 2, a hole injection layer 3, an organic light-emission layer 5, an electron transport layer 6, and a cathode 7 are disposed in the stated order above the upper surface of the TFT substrate 1.

Each organic EL element (100R, 100G, 100B) includes a separate anode 2 and a separate organic light-emission layer 5. Meanwhile, the hole injection layer 3, the electron transport layer 6, and the cathode 7 are continuous layers each covering the substrate 1 entirely. In the panel 100, the organic EL elements 100R, 100G, 100B are top-emission type organic EL elements due to the anodes 2 being formed by using material reflecting visible light and the cathode 7 being formed by using material transmitting visible light. Meanwhile, forming the substrate 1 and the anodes 2 by using material transmitting visible light and the cathode 7 by using material reflecting visible light results in the organic EL elements 100R, 100G, 100B being bottom-emission type organic EL elements.

Note that in the panel 100, bus bar (auxiliary wiring) areas may be disposed along the X direction, one for each pixel or one for each set of several pixels, for example.

[CF Substrate 20]

As illustrated in FIG. 1, the CF substrate 20 has a first area A3, a boundary area A4 surrounding the first area A3, and a second area A5 that is located further outwards than the boundary area A4. The first area A3 faces the display area A1 of the EL substrate 10, the boundary area A4 faces the boundary area A6 of the EL substrate 10, and the second area A5 faces the peripheral area A2 of the EL substrate 10.

As illustrated in FIG. 2, the CF substrate 20 includes a base substrate 11, and on an upper surface of the base substrate 11, a plurality of black matrices (BMs) 12, a plurality of color filter (CF) layers 13R, a plurality of color filter layers 13G, and a plurality of color filter layers 13B. The black matrices 12 are each disposed at a position corresponding to that of a barrier wall 4 of the EL substrate 10. Further, each color filter layer (13R, 13G, 13B) is disposed at a position corresponding to that of an organic light-emission layer 5 of the EL substrate 10. The black matrices 12 and the color filter layers 13R, 13G, 13B are formed within the first area A3 of the CF substrate 20.

[Resin Sealing Layer 14 and Cured Sealing Resin Part 15]

The resin sealing layer 14 is a sealing layer that covers the display area A1 of the EL substrate 10 and the first area A3 of the CF substrate 20 and thereby provides tight sealing between the display area A1 and the first area A3. For example, the resin sealing layer 14 contains heat curable resin or energy ray curable resin, such as ultraviolet curable resin.

The cured sealing resin part 15 covers the boundary area A6 of the EL substrate 10 and the boundary area A4 of the CF substrate 20 and thereby provides tight sealing between the boundary area A6 and the boundary area A4. The cured sealing resin part 15 contains the same material as the resin sealing layer 14 (is formed from "uncured sealing resin 140" illustrated in FIGS. 5A, 5B, 5C). The sealing resin in the cured sealing resin part 15 has a higher degree of polymerization than the same sealing resin in the resin sealing layer 14, has more cross linking structures than the same sealing resin in the resin sealing layer 14, has smaller inter-molecular distance than the same sealing resin in the resin sealing layer 14, and has greater hardness than the same sealing resin in the resin sealing layer 14. The relatively small inter-molecular distance in the sealing resin in the cured sealing resin part 15 may be a result of heat.

Note that the panel 100 is characterized in that an average height h2 of the cured sealing resin part 15 in the Z direction is slightly smaller than a maximum height h1 of the resin sealing layer 14 in the Z direction. This is since the volume of the sealing resin in the cured sealing resin part 15 is smaller than the volume of the sealing resin in the resin sealing layer 14 due to volume shrinkage of the sealing resin in the cured sealing resin part 15 having occurred. The volume shrinkage is a result of cross linking having progressed to a further extent in the cured sealing resin part 15 than in the resin sealing layer 14, which brings about linking of monomers and a decrease in inter-molecular distance. The decrease in inter-molecular distance in the sealing resin in the cured sealing resin part 15 may be a result of heat.

(Method of Manufacturing Panel 100)

The following describes a method of manufacturing the panel 100, with reference to cross-sectional views illustrating steps in the manufacturing of the panel 100 (FIGS. 3A through 3D, FIGS. 4A and 4B, and FIGS. 7A and 7B) and perspective views illustrating steps in the manufacturing of the panel 100 (FIGS. 5A through 5C and FIGS. 6A and 6B).

To provide an overall explanation of the manufacturing of the panel 100, the EL substrate 10 and the CF substrate 20 are first prepared. Then, a sealing resin-provided CF substrate 30 (refer to FIG. 6A) is prepared. Finally, manufacturing of the panel 100 is completed by joining the EL substrate 10 with the sealing resin-provided CF substrate 30.

[Preparation of EL Substrate 10]

First, a metal thin film containing Ag, for example, is formed at a predetermined area on the substrate 1 (i.e., the display area A1). For example, the forming of the metal thin film is performed by sputtering or vapor deposition. The anodes 2 are formed on the substrate 1 with a predetermined distance between one another by patterning the metal thin film by photolithography.

Subsequently, a thin film containing a transition metal is formed so as to cover entirely the display area A1, within which the anodes 2 have been formed. For example, the forming of the thin film containing a transition metal is performed by sputtering. The hole injection layer 3 is formed by oxidizing the thin film containing a transition metal.

Figure 3A:
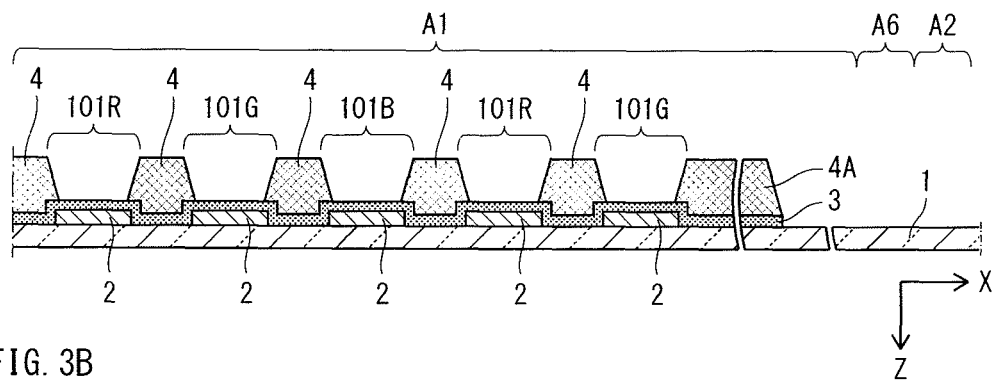

Then, a layer of barrier wall material is disposed on the surface of the hole injection layer 3. For example, the forming of the barrier wall material layer is performed by spin-coating. Subsequently, a photosensitive resist layer containing ultraviolet curable resin, acrylic resin, polyimide resin, or novolac-type phenolic resin, for example, is disposed to cover the barrier wall material layer entirely. By performing exposure using a pattern mask based on photolithography, some parts of the barrier wall material layer are hardened. Subsequently, developing and baking of the barrier wall material layer are performed in the stated order, to form the barrier walls 4, 4A and the openings 101R, 101G, 101B (FIG. 3A).

Figure 3B:
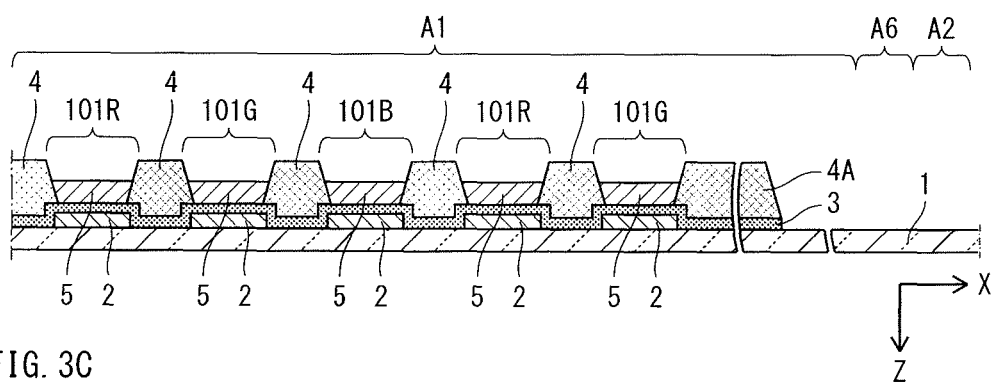

Following this, ink containing an organic light-emission material and a solvent is prepared. The ink is applied with respect to each opening (101R, 101G, 101B) between adjacent barrier walls (4, 4A). The application of the ink is performed through a wet process based on the inkjet method. The organic light-emission layers 5 are formed by causing the ink solvent to evaporate (FIG. 3B).

Figure 3C:
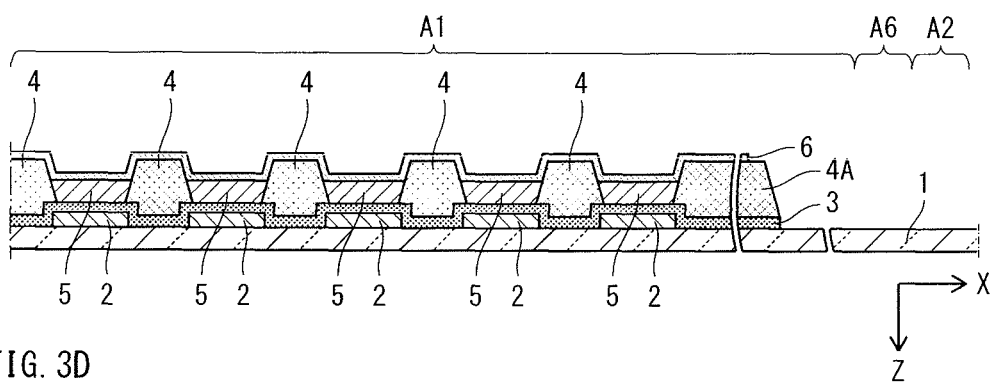
Figure 3D:
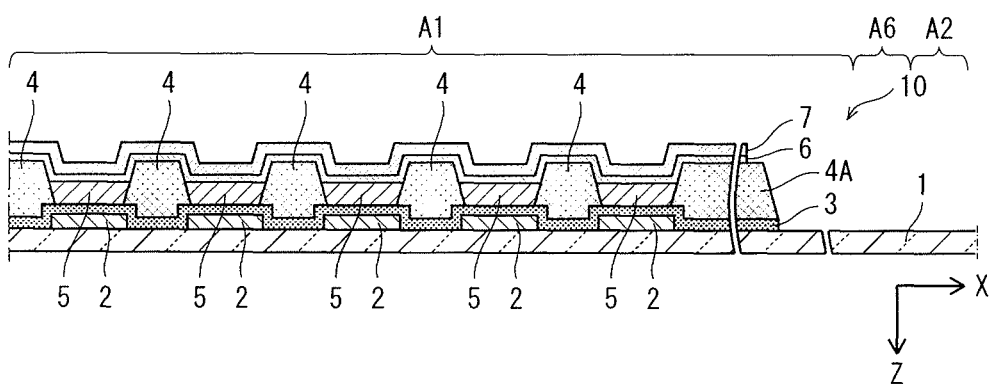

Subsequently, the electron transport layer 6 is formed to cover the organic light-emission layers 5 and the barrier walls (4, 4a) entirely (FIG. 3C). For example, the forming of the electron transport layer 6 is performed by vapor deposition. Further, the cathode 7 is formed on the electron transport layer 6 (FIG. 3D). The forming of the cathode 7 is performed in a similar way as the forming of the electron transport layer 6, i.e., by vapor deposition for example.

This completes the manufacturing of the EL substrate 10.

[Preparation of CF Substrate 20]

First, the base substrate 11 is prepared by using glass material. Then, ultraviolet/heat curable sealing resin material containing a black pigment is applied with respect to a predetermined area on a surface of the base substrate 11 (i.e., the first area A3). The black matrices 12 are formed by performing patterning based on photolithography (FIG. 4A). Here, the black matrices 12 are disposed at positions corresponding to positions of the barrier walls 4 of the EL substrate 10.

Subsequently, ink containing color filter material of one of the colors R, G, B is applied with respect to each area between adjacent black matrices 12. Here, the color of the color filter material applied with respect to a given area is determined based on the color of an opening (101R, 101G, 101B) of the EL substrate 10 corresponding in position to the given area. Then, the color filter layers 13R, 13G, 13B are formed by causing ink solvent to evaporate (FIG. 4B).

This completes the manufacturing of the CF substrate 20.

[Preparation of Sealing Resin-Provided CF substrate 30]

Subsequently, the sealing resin-provided CF substrate 30 is prepared by using the CF substrate 20 and performing the following steps in the stated order. The steps include: a preparing step; a sheet material contact step; a boundary area curing step; a removing step; and a joining step.

(Preparing Step)

In this step, as illustrated in FIG. 5A, a sheet material 40 is prepared. The sheet material 40 includes a first separable layer 140A (a resin film layer of relatively great thickness), a second separable layer 140B (a resin film layer of relatively small thickness), and a sheet of uncured sealing resin 140 between the first separable layer 140A and the second separable layer 140B. For example, the uncured sealing resin 140 contains heat curable resin or energy ray curable resin, such as ultraviolet curable resin.

(Sheet Material Contact Step)

In this step, the second separable layer 140B of the sheet material 40 is first removed. Removal of the second separable layer 140B exposes one surface of the uncured sealing resin 140. Then, the uncured sealing resin 140 is turned over, and the exposed surface of the uncured sealing resin 140 is put in intimate contact with the entirety of a surface of the CF substrate 20 on which the black matrices 12 and the color filter layers 13R, 13G, 13B are formed (FIG. 5A). Thus, the first area A3, the boundary area A4 surrounding the first area A3, and the second area A5 outside the boundary area A4 are each covered entirely by the uncured sealing resin 140. Note that instead of turning over the uncured sealing resin 140 and the first separable layer 140A as illustrated in FIG. 5A, the CF substrate 20 may be turned over and put in intimate contact with the uncured sealing resin 140 when the uncured sealing resin 140 is considerably soft.

(Boundary Area Curing Step)

In this step, an energy ray is radiated with respect to some parts of the uncured sealing resin 140 to form a cured sealing resin part 142.

Embodiment 1 is characterized in that output level of a laser beam is adjusted to a low intensity such that the laser beam cures the uncured sealing resin 140 but does not damage the first separable layer 140A or the CF substrate 20. Further, the laser beam is adjusted to irradiate a predetermined area so that only the uncured sealing resin 140 covering the boundary area A4 is irradiated and thus cured with the laser beam. To provide one example of the laser output level, when using a $CO_2$ laser beam and when the first separable layer 140A and the uncured sealing resin 140 in the sheet material 40 have thicknesses of 50 μm and 20-30 μm, respectively, the energy density of the laser beam is adjusted within a range of at least 15 $mJ/cm^2$ to at most 25 $mJ/cm^2$. Note that this laser output level is considerably lower than a typical output level (e.g., within a range of at least 40 $mJ/cm^2$ to at most 65 $mJ/cm^2$) of a laser beam used when cutting uncured sealing resin and a first separable layer at the same time (refer to FIG. 15B).

Further, the uncured sealing resin 140 may contain ultraviolet curable resin, for example. Ultraviolet curable resin is one type of energy ray curable resin. In particular, the uncured sealing resin 140 may be, for example, ultraviolet curable resin that absorbs wavelength of the $CO_2$ laser beam (with peak wavelength at 10.6 μm). Such ultraviolet curable resin, when irradiated with the $CO_2$ laser beam, absorbs light from the $CO_2$ laser beam. The absorbed light generates heat that causes the ultraviolet curable resin to melt and penetrate into minute concavities and convexities existing in the surface of the CF substrate 20, which is considered as being one reason why the adhesion between the ultraviolet curable resin and the CF substrate 20 increases. In addition, the heat reduces inter-molecular distance in the ultraviolet curable resin and hardens the ultraviolet curable resin. This is considered as being another reason why the adhesion between the ultraviolet curable resin and the CF substrate 20 increases. That is, it is considered that when the $CO_2$ laser beam is radiated with respect to the ultraviolet curable resin, the adhesion between the ultraviolet curable resin and the CF substrate 20 increases, and in addition, the inter-molecular distance in the ultraviolet curable resin decreases, and the ultraviolet curable resin hardens due to a volume shrinkage of the ultraviolet curable resin. The decrease in inter-molecular distance in the ultraviolet curable resin may be a result of heat.

Following the adjustment as described above, as illustrated in FIGS. 5B and 7A, a position corresponding to the boundary area A4 is irradiated with a laser beam L1 from outside the first separable layer 140A. The laser beam L1 is radiated from a processing head 200 of a laser radiation apparatus. Moving the processing head 200 such that the irradiation position moves along the boundary area A4 results in organic molecules (monomers) in the uncured sealing resin 140, particularly those directly below a laser beam trace 141A, receiving energy from the laser beam L1 and undergoing polymerization. This polymerization causes the organic molecules to link to one another to form three-dimensional structures, whereby the sealing resin hardens. Further, heat from the laser beam L causes a reduction in volume of the sealing resin, which also results in the sealing resin hardening. Thus, the uncured sealing resin 140 covering the boundary area A4 undergoes annealing, and the cured sealing resin part 142 is formed.

Note that when the uncured sealing resin 140 contains ultraviolet curable resin, the cured sealing resin part 142 may be formed by irradiating parts of the uncured sealing resin 140 with an ultraviolet ray.

Further, the cured sealing resin part 142 need not be cured completely in the boundary area curing step. That is, it suffices for the cured sealing resin part 142 to be cured to have a higher level of hardness compared to that of the uncured sealing resin 140.

(Removing Step)

Following the boundary area curing step, as illustrated in FIGS. 5C and 7B, a part of the uncured sealing resin 140 covering the second area A5 (an unnecessary sealing resin part 143) is removed, along with the first separable layer 140A, in one direction (the X direction in this example) from one end to the other of the second area A5 (from the left side end to the right side end of the second area A5 in the drawings in this example). Note that the "one direction" above is not limited to the X direction in FIGS. 5C and 7B. However, it is preferable that the "one direction" be one direction along the X-Y plane in FIG. 5C.

The sealing resin in the cured sealing resin part 142 has been cured to adhere strongly to the CF substrate 20. Due to this, in the removing step, the movement of the cured sealing resin part 142 accompanying the movement of the first separable layer 140A is smaller compared to the movement of the unnecessary sealing resin part 143, which is yet to be cured, accompanying the movement of the first separable layer 140A. Thus, as illustrated in FIG. 7B, when the first separable layer 140A is removed away from the CF substrate 20, the unnecessary sealing resin part 143 is removed away from the CF substrate 20 along with the first separable layer 140A. On the other hand, the cured sealing resin part 142 does not move along with the first separable layer 140A. Thus, the cured sealing resin part 142 is separated from the unnecessary sealing resin part 143 at the boundary between the cured sealing resin part 142 and the unnecessary sealing resin part 143, and remains adhering to the CF substrate 20.

Further, when the removal of the first separable layer 140A and the unnecessary sealing resin part 143 progresses further in the X direction, a part of the uncured sealing resin 140 surrounded by the cured sealing resin part 142 (a non-removal sealing resin part 141) remains on the CF substrate 20 in intimate contact with the CF substrate 20, due to the cured sealing resin part 142 functioning as a wall protecting the non-removal sealing resin part 141.

The boundary area curing step and the removing step in embodiment 1, which are performed as described above, allow appropriately disposing predetermined uncured sealing resin (the non-removal sealing resin part 141) on the CF substrate 20 while preventing the surface of the CF substrate 20 from being damaged when cutting uncured sealing resin (such problem illustrated in FIG. 16).

The completion of the removing step yields the sealing resin-provided CF substrate 30, which is illustrated in FIG. 6A.

In the sealing resin-provided CF substrate 30, the cured sealing resin part 142 surrounds the non-removal sealing resin part 141. Thus, the risk of problems such as vibration, etc., of the non-removal sealing resin part 141 causing the non-removal sealing resin part 141 adhering to undesirable portions, and droplets of the non-removal sealing resin part 141 flying about elsewhere, is suppressed. This may result in advantageous effects such as easy handling of the sealing resin-provided CF substrate 30.

FIG. 12 is a photograph indicating a state where curing has been performed with respect to uncured sealing resin between a pixel area (first area A3) and a non-pixel area (second area) after removing a second separable layer from a sheet material and putting uncured sealing resin in intimate contact with a first substrate (glass substrate). Note that this photograph has been taken with the first separable layer removed, for the sake of observation. This photograph shows that between the pixel area (first area A3) and the non-pixel area (second area), a boundary area having a color different from that of the pixel area and the non-pixel area is formed. This boundary area is considered as being a cured sealing resin part. It is regarded that in the cured sealing resin part, a reduction in inter-molecular distance has taken place and polymerization reaction has progressed due to heat applied in the curing. Note that when using uncured sealing resin containing ultraviolet curable resin, a cured sealing resin part similar as that illustrated in FIG. 12 can be formed by performing curing by radiating an ultraviolet ray.

FIG. 13 is a photograph indicating a state after the first separable layer is removed from the structure shown in FIG. 12. The right side of FIG. 13 shows the glass substrate, and the left side of FIG. 13 shows uncured sealing resin which has been exposed by removal of the first separable layer. The glass substrate is exposed in FIG. 13 due to the unnecessary sealing resin part in the non-pixel area (second area) having been removed along with the first separable layer. Note that the black line in FIG. 13 is a thickness portion of the cured sealing resin part. That is, the black line in FIG. 13 indicates an end surface of the cured sealing resin part, at which the cured sealing resin part is torn upon removal of the first separable layer. The surface is not planar and has concavities/convexities.

[Joining Step]

Next, as illustrated in FIG. 6A, the EL substrate 10 is arranged with respect to the upper surface of the sealing resin-provided CF substrate 30 such that the display area A1 faces the non-removal sealing resin part 141 and the boundary area A6 faces the cured sealing resin part 142. Then, a cathode-side face of the EL substrate 10 is put in contact with the non-removal sealing resin part 141. Accordingly, the display area A1 is covered by the non-removal sealing resin part 141, and the boundary area A6 is covered by the cured sealing resin part 142.

Subsequently, curing of the non-removal sealing resin part 141 is performed by heating the non-removal sealing resin part 141 or irradiating the non-removal sealing resin part 141 with an ultraviolet ray, from the side of the CF substrate 20. Thus, the resin sealing layer 14 is formed.

When performing heating to cure the non-removal sealing resin part 141, an appropriate distance between the EL substrate 10 and the CF substrate 20 is maintained even when the non-removal sealing resin part 141 softens due to the heating. This is since the cured sealing resin part 142, having a certain level of hardness, functions as a spacer between the EL substrate 10 and the CF substrate 20. Further, when the joining step is performed in a low-pressure chamber, etc., the displacement of the non-removal sealing resin part 141 due to vacuum degasification can be prevented by the cured sealing resin part 142.

Further, note that the heating or ultraviolet radiation for curing the non-removal sealing resin part 141 also causes the cured sealing resin part 142 to be cured to a further extent. Thus, the cured sealing resin part 15 is formed (FIG. 6B).

Thus, the manufacturing of the panel 100 is completed.

Embodiment 2

The following described embodiment 2 of the present disclosure, with focus on aspects of embodiment 2 differing from embodiment 1.

A major difference between embodiments 1 and 2 is that, in embodiment 2, only the first separable layer 140A is cut by a laser beam in the boundary area curing step, and an first separable layer outer part 143A is removed along with the unnecessary sealing resin part 143 by using a removal tape 145.

[Sheet Material Contact Step]

In the sheet material contact step in embodiment 2, the second separable layer 140B of the sheet material 40 is removed, and the uncured sealing resin 140 is put in intimate contact with the entire surface of the CF substrate 20 (FIG. 8A). This is similar to the sheet material contact step in embodiment 1, which is illustrated in FIG. 5A.

[Boundary Area Curing Step]

In the boundary area curing step in embodiment 2, the output level of the laser radiation apparatus is adjusted to a low intensity such that a laser beam cuts the first separable layer 140A and cures the uncured sealing resin 140 covering the boundary area A4. To provide one example of the laser output level, when using a $CO_2$ laser beam and when the thickness of the first separable layer 140A and the uncured sealing resin 140 in the sheet material 40 is 50 μm and 20-30 μm, respectively, the energy density of the laser beam is adjusted within a range of at least 25 mJ/cm$^2$ to at most 40 mJ/cm$^2$.

Following the adjustment as described above, the processing head 200 is moved such that irradiation with the laser beam is performed along the boundary area A4 from outside the first separable layer 140A. As illustrated in FIGS. 8B and 10A, this process is performed such that the laser beam cuts the first separable layer 140A along a laser beam trace 142A and cures the uncured sealing resin 140 covering the boundary area A4.

Note that the boundary area curing step in embodiment 2 is similar to the boundary area curing step in embodiment 1 in that since the laser output level of the laser radiation apparatus is adjusted such that the laser does not cut the uncured sealing resin 140, the CF substrate 20 is not damaged by the laser beam.

[Removing Step]

The removing step in embodiment 2 includes the following steps performed in the stated order: a film removing step; a tape adhesion step; and a tape removing step.

(Film Removing Step)

In this step, the first separable layer outer part 143A, which corresponds to the second area A5, is removed by being peeled off in the X direction from one end to the other of the second area A5 (FIG. 8C). Thus, the unnecessary sealing resin part 143 is exposed, and a first separable layer inner part 144A covering the first area A3 remains on the CF substrate 20 (FIG. 10B).

(Tape Adhesion Step)

Figure 9A:
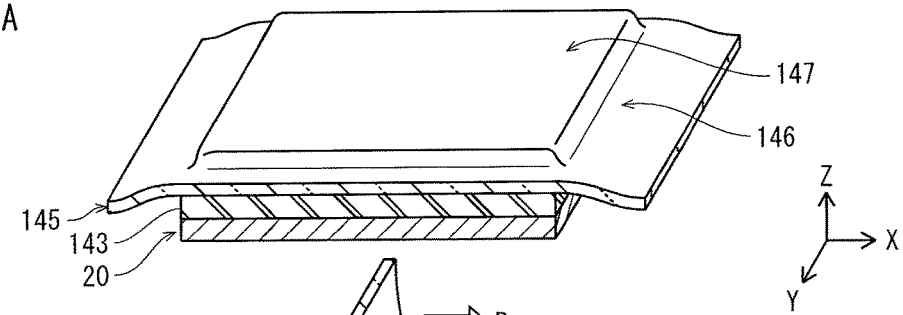

In the subsequent tape adhesion step, as illustrated in FIGS. 9A and 11A, the removal tape 145 is adhered to extend over the first separable layer inner part 144A corresponding to the first area A3 and the unnecessary sealing resin part 143 covering the second area A5. In this process, a tape adhesion part 146 of the removal tape 145 is put in intimate contact with the unnecessary sealing resin part 143, and a tape adhesion part 147 of the removal tape 145 is put in intimate contact with the first separable layer inner part 144A.

(Tape Removing Step)

Figure 9B:
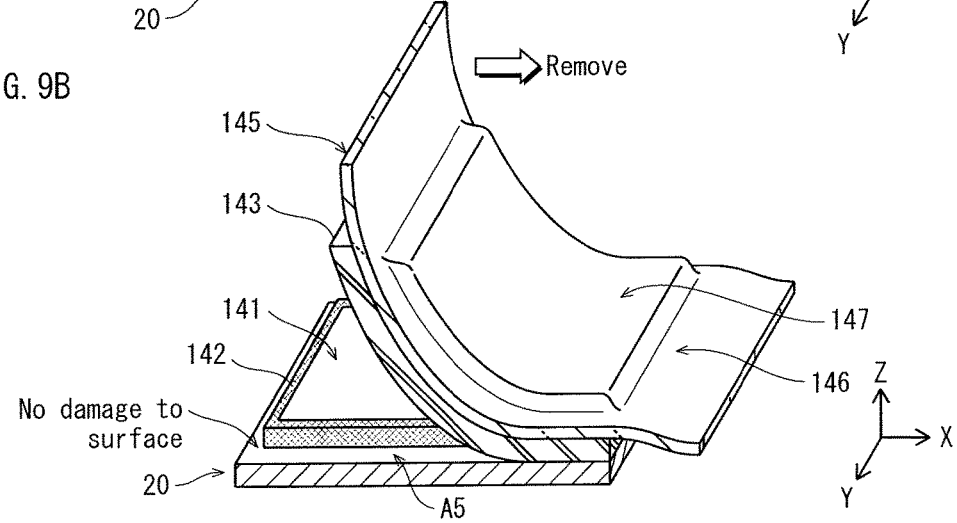

In the subsequent tape removing step, the first separable layer inner part 144A and the unnecessary sealing resin part 143, along with the removal tape 145, are removed in one direction (the X direction in this example) from one end to the other of the second area A5 (from the left side end to the right side end of the second area A5 in the drawings in this example), as illustrated in FIGS. 9B and 11B. Thus, the unnecessary sealing resin part 143 is removed while the cured sealing resin part 142 and the non-removal sealing resin part 141 remain on the CF substrate 20.

The completion of the tape removing step results in a portion of the CF substrate 20, which has not been damaged by the laser beam, being exposed at the second area A5 (FIG. 9B). This yields a sealing resin-provided CF substrate 30A.

[Adhesion Step]

Figure 9C:
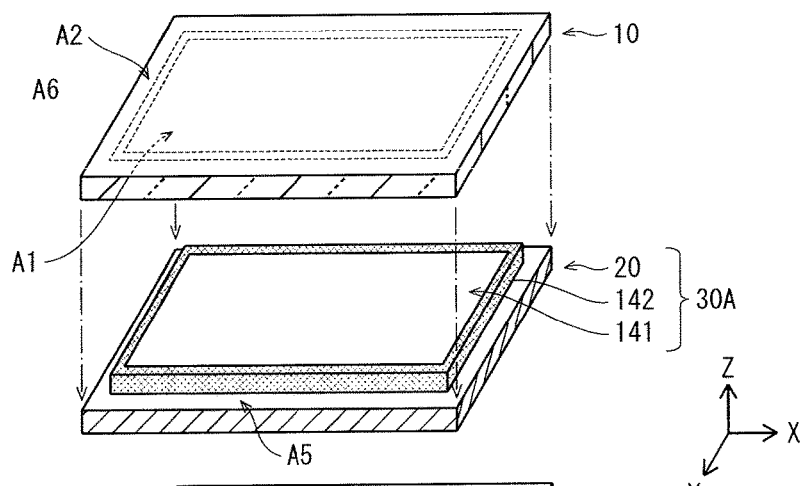
Figure 9D:
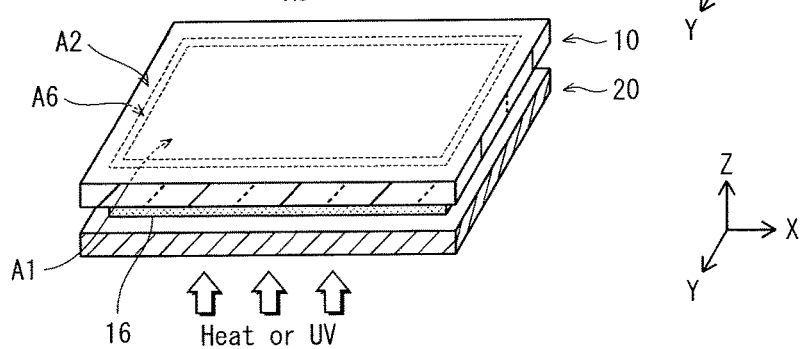

Following the removing step, an adhesion step similar to the adhesion step illustrated in FIGS. 6A and 6B is performed. In specific, the EL substrate 10 is arranged to face the sealing resin-provided CF substrate 30A, and heating or ultraviolet radiation is performed. Accordingly, the resin sealing layer 14 is formed by the non-removal sealing resin part 141 being cured. In addition, the polymerization of the cured sealing resin part 142 further progresses, whereby the cured sealing resin part 16 is formed (FIGS. 9C and 9D).

Thus, the manufacturing of the panel 100 is completed.

<Modifications>

FIGS. 14A through 14C each illustrate a modified laser beam trace in the boundary area curing step. The laser beam trace in the boundary area curing step may be adjusted as appropriate according to the desired shape of the periphery of the non-removal sealing resin part 141.

For example, laser radiation with respect to the uncured sealing resin 140 may be performed such that a laser beam trace 141A1 illustrated in FIG. 14A, which has a lattice shape, is formed. When performing laser radiation in such a manner, the design margin for scanning by using the processing head 200 becomes wider.

Alternatively, laser radiation with respect to the uncured sealing resin 140 may be performed such that a laser beam trace 141A2 illustrated in FIG. 14B is formed. The laser beam trace 141A2 corresponds to the lattice-shaped laser beam trace 141A1 without the Y-direction protrusions P.

Alternatively, laser radiation with respect to the uncured sealing resin 140 may be performed such that a laser beam trace 141A3 illustrated in FIG. 14C is formed. The laser beam trace 141A3 corresponds to the lattice-shaped laser beam trace 141A1 with wavy lines at all portions thereof instead of straight lines.

Here, it should be noted that when a cut of a complicated shape exists at the boundary between the cured sealing resin part 142 and the unnecessary sealing resin part 143, there is a risk of the unnecessary sealing resin part 143 being torn off and not being removed when removing the unnecessary sealing resin part 143 along with the second separable layer in the removing step. The setting of the laser beam trace is to be performed while keeping this in mind.

<Other Matters>

In the embodiments, description is provided taking an organic EL display panel as one example of the joined body pertaining to the present disclosure. Alternatively, the joined body pertaining to the present disclosure may be another type of a joined body. For example, the joined body pertaining to the present disclosure may be an electrostatic touch panel or a liquid crystal panel.

In the embodiments, description is provided that the CF substrate 20 is the first substrate and the EL substrate 10 is the second substrate. Alternatively, the EL substrate 10 may be the first substrate and the CF substrate 20 may be the second substrate.

Further, a modification may be made such that the first substrate has a belt-like shape. For example, the first substrate may be a sheet body continuously drawn out from a role. When making such a modification, the first area may be disposed in plurality in the first substrate. Further, when making such a modification, a plurality of joined bodies may be formed with respect to the plurality of first areas, and the separation of the joined bodies from one another may be performed by cutting the first substrate.

Further, when making such a modification, particularly when the first substrate is the CF substrate 20, a plurality of first areas A3 may be formed with respect to the base substrate 11 having the belt-like shape along a lengthwise direction of the base substrate 11, and the black matrices 12 and the color filter layers 13R, 13G, 13B may be formed within each of the first areas A3. When making such a modification, a further modification may be made of providing the substrate 1, which is the second substrate, also with a belt-like shape, forming a plurality of display areas A1 on the substrate 1, arranging each of the display areas A1 and one of the first areas A3 to face each other with the uncured sealing resin 140 in between, and forming an organic EL display panel that is the joined body pertaining to the present disclosure.

In the embodiments, description is provided based on examples where the first substrate and the second substrate have plate-like shapes. Alternatively, each of the first substrate and the second substrate may have a shape other than a plate-like shape. For example, each of the first substrate and the second substrate may have the shape of a rectangular solid or a sphere.

In the embodiments, description is provided on examples involving a sheet material including a pair of separable layers (films) and uncured sealing resin sandwiched between the separable layers. Alternatively, a sheet material may be used that includes only one separable layer and uncured sealing resin disposed on the single separable layer.

INDUSTRIAL APPLICABILITY

The method of manufacturing a joined body pertaining to the present disclosure is widely applicable in, for example, the manufacture of organic EL display panels.

REFERENCE SIGNS LIST

1 TFT substrate
2 anode
3 hole injection layer
4 barrier wall (bank)
5 organic light-emission layer
6 electron transport layer
7 cathode
10 EL substrate
11 base substrate
12 black matrix (BM)
13R, 13G, 13B color filter layer
14 resin sealing layer
15, 16, 142 cured sealing resin part
20 CF substrate
20X first substrate
30, 30A sealing resin-provided CF substrate
40 sheet material
100 organic EL display panel
140 uncured sealing resin
140A film layer (first separable layer)
140B film layer (second separable layer)
141 non-removal sealing resin part
141A, 141A1, 141A2, 141A3, 142A, 142X laser beam trace
143 unnecessary sealing resin part
143A first separable layer outer part
144A first separable layer inner part
145 removal tape
146, 147 tape adhesion part

The invention claimed is:

1. A joined body comprising:
a first substrate;
a first sealing resin layer that covers a first area of the first substrate;
a second sealing resin layer that covers a boundary area of the first substrate, is continuous with the first sealing resin layer, and contains a same material as the first sealing resin layer, the boundary area being an area of the first substrate surrounding the first area; and
a second substrate that is joined with the first substrate via the first sealing resin layer and the second sealing resin layer, wherein
an average film thickness of the second sealing resin layer is smaller than a maximum film thickness of the first sealing resin layer, and
an extent of cross-linking in the second sealing resin layer is greater than an extent of cross-linking in the first sealing resin layer.

2. The joined body of claim 1, wherein
the first substrate has a plate-like shape and a plurality of light-emission elements is disposed in the first area.

3. The joined body of claim 2, wherein
the second substrate has a plate-like shape and a plurality of color filter layers is disposed in an area of the second substrate facing the first area of the first substrate, the color filter layers being disposed such that a position of each of the color filter layers corresponds to a position of one of the light-emission elements.

4. The joined body of claim 1, wherein
a degree of polymerization of the same material is higher in the second sealing resin layer than in the first sealing resin layer.

5. The joined body of claim 1, wherein
the first sealing resin layer and second sealing resin layer include a same material composition.

6. The joined body of claim 1, wherein
the first sealing resin layer includes only the same material.

7. The joined body of claim 6, wherein
the same material of the first sealing resin layer contacts the second substrate.

8. The joined body of claim 6, wherein
the same material of the second sealing resin layer includes more cross-linking structures than the same material of the first sealing resin layer,
the same material of the second sealing resin layer includes a smaller inter-molecular distance than the same material of the first sealing resin layer, and
the same material of the second sealing resin layer includes a greater hardness than the same material of the first sealing resin layer.

* * * * *